US012641893B2

(12) United States Patent
Zhou

(10) Patent No.: US 12,641,893 B2
(45) Date of Patent: May 26, 2026

(54) BACKSIDE ILLUMINATION IMAGE SENSOR HAVING CHARGE ACCUMULATION REGIONS SURROUNDED BY A CHANNEL REGION ON THE SURFACE OF A VERTICAL PHOTODIODE AND PREPARATION METHOD THEREOF

(71) Applicants: SHANGHAI IC R&D CENTER CO., LTD., Shanghai (CN); CHENGDU IMAGE DESIGN TECHNOLOGY CO., LTD., Chengdu (CN)

(72) Inventor: Yang Zhou, Shanghai (CN)

(73) Assignees: SHANGHAI IC R&D CENTER CO., LTD., Shanghai (CN); CHENGDU IMAGE DESIGN TECHNOLOGY CO., LTD., Chengdu (CN)

( * ) Notice: Subject to any disclaimer, the term of this patent is extended or adjusted under 35 U.S.C. 154(b) by 368 days.

(21) Appl. No.: 18/270,197

(22) PCT Filed: Dec. 24, 2021

(86) PCT No.: PCT/CN2021/141208
§ 371 (c)(1),
(2) Date: Jun. 28, 2023

(87) PCT Pub. No.: WO2022/143460
PCT Pub. Date: Jul. 7, 2022

(65) Prior Publication Data
US 2024/0321931 A1      Sep. 26, 2024

(30) Foreign Application Priority Data
Dec. 29, 2020    (CN) .......................... 202011592644.6

(51) Int. Cl.
H10F 39/12      (2025.01)
H10F 39/00      (2025.01)
H10F 39/18      (2025.01)

(52) U.S. Cl.
CPC ......... *H10F 39/199* (2025.01); *H10F 39/014* (2025.01); *H10F 39/18* (2025.01);
(Continued)

(58) Field of Classification Search
CPC ...... H10F 39/199; H10F 39/014; H10F 39/18; H10F 39/184; H10F 39/8033; H10F 39/8057; H10F 39/807; H10F 39/80377
See application file for complete search history.

(56) References Cited

U.S. PATENT DOCUMENTS

2016/0240720 A1*   8/2016   Aurola .............. H10F 39/80377
2019/0035828 A1*   1/2019   Han ...................... H10F 39/024
2023/0116531 A1*   4/2023   Wang .................... H04N 25/57
348/294

FOREIGN PATENT DOCUMENTS

CN          102270646 A   *  12/2011

* cited by examiner

*Primary Examiner* — Eliseo Ramos Feliciano
*Assistant Examiner* — Brad A Knudson
(74) *Attorney, Agent, or Firm* — Bayramoglu Law Offices LLC

(57) ABSTRACT

The present invention is to provide a backside illumination image sensor and a preparation method thereof. A photodiode and a channel region are surrounded by an isolation ring passing through a semiconductor substrate and an epitaxial layer; a source region and a drain region extend from a surface of the channel region to an interior of the channel region and surround a charge accumulation region, the source region and the charge accumulation region are isolated by the channel region. The preparation method of the isolation ring of the backside illumination image sensor (Continued)

is compatible with a conventional CMOS process flow. By multiple implantations, the photodiode and the source region are vertically distributed in the isolation ring, thus reducing the parasitic capacitance of a charge transfer tube, increasing the transfer rate, and improving the image frame rate of an image sensor chip.

10 Claims, 6 Drawing Sheets

(52) U.S. Cl.
CPC ..... *H10F 39/184* (2025.01); *H10F 39/80377* (2025.01); *H10F 39/8057* (2025.01); *H10F 39/807* (2025.01); *H10F 39/8033* (2025.01)

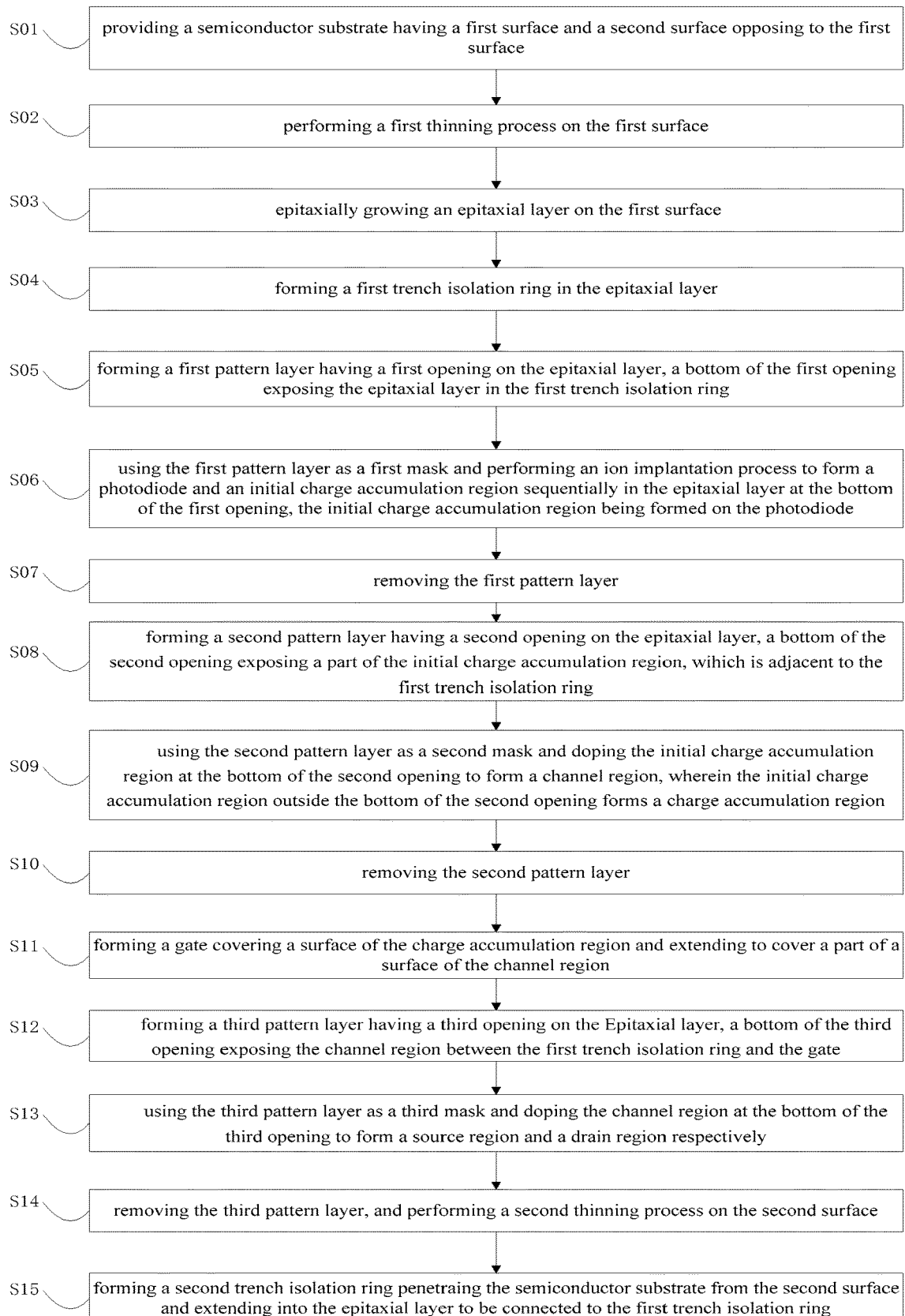

S01  providing a semiconductor substrate having a first surface and a second surface opposing to the first surface S02  performing a first thinning process on the first surface S03  epitaxially growing an epitaxial layer on the first surface S04  forming a first trench isolation ring in the epitaxial layer S05  forming a first pattern layer having a first opening on the epitaxial layer, a bottom of the first opening exposing the epitaxial layer in the first trench isolation ring S06  using the first pattern layer as a first mask and performing an ion implantation process to form a photodiode and an initial charge accumulation region sequentially in the epitaxial layer at the bottom of the first opening, the initial charge accumulation region being formed on the photodiode S07  removing the first pattern layer S08  forming a second pattern layer having a second opening on the epitaxial layer, a bottom of the second opening exposing a part of the initial charge accumulation region, wihich is adjacent to the first trench isolation ring S09  using the second pattern layer as a second mask and doping the initial charge accumulation region at the bottom of the second opening to form a channel region, wherein the initial charge accumulation region outside the bottom of the second opening forms a charge accumulation region S10  removing the second pattern layer S11  forming a gate covering a surface of the charge accumulation region and extending to cover a part of a surface of the channel region S12  forming a third pattern layer having a third opening on the Epitaxial layer, a bottom of the third opening exposing the channel region between the first trench isolation ring and the gate S13  using the third pattern layer as a third mask and doping the channel region at the bottom of the third opening to form a source region and a drain region respectively S14  removing the third pattern layer, and performing a second thinning process on the second surface S15  forming a second trench isolation ring penetraing the semiconductor substrate from the second surface and extending into the epitaxial layer to be connected to the first trench isolation ring

FIG. 3

BACKSIDE ILLUMINATION IMAGE SENSOR HAVING CHARGE ACCUMULATION REGIONS SURROUNDED BY A CHANNEL REGION ON THE SURFACE OF A VERTICAL PHOTODIODE AND PREPARATION METHOD THEREOF

CROSS-REFERENCE TO RELATED APPLICATION

This application claims priority of International Patent Application Serial No. PCT/CN2021/141208, filed on Dec. 24, 2021, which is related to and claims priority of Chinese Patent Application Serial No. CN202011592644.6, filed on Dec. 29, 2020. The entirety of each of the above-mentioned patent applications is hereby incorporated herein by reference and made part of this specification.

TECHNICAL FIELD

The disclosure relates to the technical field of semiconductors, in particular to a backside illuminated image sensor and a preparation method thereof.

BACKGROUND

With the development of image recognition technology, CMOS APS (CMOS active pixel sensor) has become an important device for image recognition technology due to its advantages of high integration, small size and low power consumption.

However, compared with the charge-coupled device (CCD), the CMOS APS has poor dynamic range, sensitivity and noise indicators. For example, when the light intensity changes drastically, crosstalk occurs between adjacent pixels, which limits the performance in high-quality imaging application. FIG. 1 shows a schematic diagram of a conventional backside-illuminated pixel structure. The backside illuminated image sensor comprises a PPD (Pinned Photo Diode), a charge transfer tube, and a floating diffusion (FD) for charge storage. As shown in FIG. 1, the PPD and FD adopt a parallel plane structure, which increases the pixel area and the parasitic capacitance, thus reducing the charge transfer rate and limiting the operating frequency of an image sensor chip.

In addition, in the field of autonomous driving, the CMOS APS is used for recording far-infrared light remote sensing observations, which can effectively reduce environmental impacts such as dense fog and low illumination. However, even if the backside of a BSI (backside illumination) image sensor is thinned, the thickness of the photosensitive layer thereof is up to about 3 μm. For small-sized pixel image sensors, half of long wavelength lights with lower energy such as red lights cannot be completely absorbed. The sensitivity to infrared light is very low, which results in problems such as insufficient full well charge, poor imaging quality and other issues.

SUMMARY

The purpose of the present invention is to overcome the above-mentioned defects existing in the prior art, and to provide a backside illuminated image sensor and a preparation method thereof.

To realize the above purpose, the first part of the invention provides a backside illuminated image sensor, comprising: a semiconductor substrate having a first surface and a second surface opposing to the first surface; an epitaxial layer covering the first surface; a photodiode formed in the epitaxial layer; a charge accumulation region and a channel region formed on a surface of the photodiode respectively, the charge accumulation region being surrounded by the channel region; an isolation ring surrounding the photodiode and the channel region and penetrating the semiconductor substrate and the epitaxial layer; a source region and a drain region extending from a surface of the channel region to an interior of the channel region, which are formed at two sides of the charge accumulation region respectively and separated by the charge accumulation region; a gate covering a surface of the charge accumulation region, and extending over the surface of the channel region along a first direction to a surface of the source region; wherein, the photodiode comprises a first photosensitive region and a second photosensitive region, and the second photosensitive region is formed on the first photosensitive region and covers a surface of the first photosensitive region.

Preferably, the backside illuminated image sensor further comprising: a photosensitive device and a light shielding layer respectively formed on the second surface, wherein the photosensitive device covers the photodiode, and the light shielding layer surrounds the photosensitive device and covers the isolation ring.

Preferably, the isolation ring comprises a first trench isolation ring and a second trench isolation ring, wherein the first trench isolation ring extends from a surface of the epitaxial layer into an interior of the epitaxial layer; the second trench isolation ring penetrates the semiconductor substrate by extending from the second surface into the interior the epitaxial layer, and is connected to the first trench isolation ring.

Preferably, a top surface of the first trench isolation ring is higher than the surface of the epitaxial layer.

Preferably, a vertical distance between a bottom surface of the first trench isolation ring and the first surface is less than a vertical distance between a bottom surface of the photodiode and the first surface.

Preferably, the semiconductor substrate, the charge accumulation region, the source region and the second photosensitive region are of a first conductivity type, the epitaxial layer, the channel region and the first photosensitive region are of a second conductivity type, the first conductivity type is opposite to the second conductivity type.

The invention further provides a preparation method for a backside illuminated image sensor, comprising: S01, providing a semiconductor substrate having a first surface and a second surface opposing to the first surface; S02, performing a first thinning process on the first surface; S03, epitaxially growing an epitaxial layer on the first surface; S04, forming a first trench isolation ring in the epitaxial layer; S05, forming a first pattern layer having a first opening on the epitaxial layer, a bottom of the first opening exposing the epitaxial layer in the first trench isolation ring; S06, using the first pattern layer as a first mask and performing an ion implantation process to form a photodiode and an initial charge accumulation region sequentially in the epitaxial layer at the bottom of the first opening, the initial charge accumulation region being formed on the photodiode; S07, removing the first pattern layer; S08, forming a second pattern layer having a second opening on the epitaxial layer, a bottom of the second opening exposing a part of the initial charge accumulation region which is adjacent to the first trench isolation ring; S09, using the second pattern layer as a second mask and doping the initial charge accumulation region at the bottom of the second opening to form a channel region, wherein the initial charge accumulation region outside the bottom of the second opening forms a charge accumulation region; S10, removing the second pattern layer; S11, forming a gate covering a surface of the charge accumulation region and extending to cover a part of a surface of the channel region; S12, forming a third pattern layer having a third opening on the epitaxial layer, a bottom of the third opening exposing the channel region between the first trench isolation ring and the gate; S13, using the third pattern layer as a third mask and doping the channel region at the bottom of the third opening to form a source region and a drain region respectively; S14, removing the third pattern layer, and performing a second thinning process on the second surface; S15, forming a second trench isolation ring penetrating the semiconductor substrate from the second surface and extending into the epitaxial layer to be connected to the first trench isolation ring.

Preferably, the step of performing the ion implantation process to form the photodiode and the initial charge accumulation region sequentially in the epitaxial layer at the bottom of the first opening comprises: forming a first photosensitive region by a first ion implantation, and forming a second photosensitive region on the first photosensitive region by a second ion implantation, wherein the first photosensitive region and the second photosensitive region form the photodiode; forming the initial charge accumulation region by a third ion implantation; wherein, the first ion implantation comprises implanting boron ions with a first implantation energy; the second ion implantation comprises implanting phosphorus ions with a second implantation energy; the third ion implantation comprises implanting phosphorus ions with a third implantation energy.

Preferably, the second implantation energy is less than the first implantation energy, and greater than the third implantation energy.

Preferably, the channel region is formed by a fourth ion implantation, the fourth ion implantation comprises implanting boron ions with a fourth implantation energy which is 3~5 times of the third implantation energy; the source region and the drain region are formed by a fifth ion implantation, and implanted ions thereof comprise phosphorus ions.

In summary, the present invention provides a backside illuminated image sensor and a preparation method thereof. According to the preparation method, the manufacturing of the isolation ring of the backside illuminated image sensor is compatible with a conventional CMOS process flow. Moreover, the photodiode, the electric charges accumulation region, the source and the drain are vertically distributed and formed by multiple implantations within the isolation ring, so as to reduce the parasitic capacitance of the charge transfer tube, improve the transfer rate of the charge transfer tube, and improve the image frame rate of the image sensor chip. Meanwhile, the charge accumulation region is formed in the semiconductor substrate, which does not occupy additional pixel areas, thus maximizing the filling rate, effectively improving the photosensitivity and expanding the full well charge capacity of the pixel. Compared with a traditional backside illuminated image sensor, the backside of the semiconductor substrate is further thinned, which shortens the travelling path along which the infrared lights reach the photodiode. The isolation ring surrounding the photodiode forms an inversion layer, so as to amplify the charges induced by weak lights, enhance the inductive ability of the low-energy infrared light. Furthermore, the isolation ring also shields the leakage paths between the adjacent pixels, thus the dark current is smaller.

BRIEF DESCRIPTION OF THE DRAWINGS

FIG. 3 is a flow chart of a preparation method of a backside illuminated image sensor according to an embodiment of the present invention;

DETAILED DESCRIPTION

The specific embodiments of the present invention will be further described in detail below with reference to the accompanying drawings.

It should be noted that, in the following specific embodiments, when describing the embodiments of the present invention in detail, in order to clearly represent the structure of the present invention and facilitate the description, the structures in the accompanying drawings are not drawn according to the general scale, and the Partial enlargement, deformation and simplification of processing are shown, therefore, it should be avoided to interpret this as a limitation of the present invention.

Figure 1:
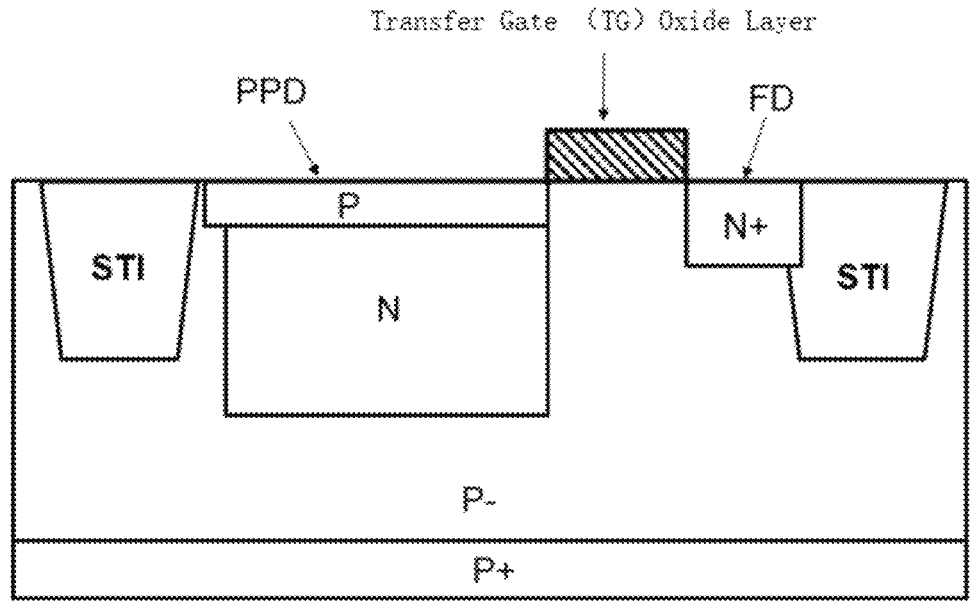
FIG. 1 is a schematic structural diagram of a conventional backside illuminated image sensor.
Figure 2:
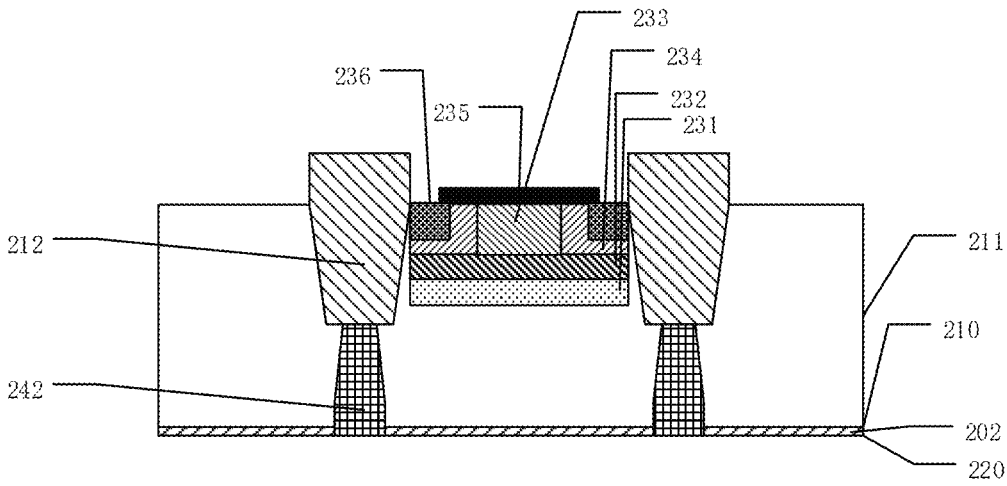
FIG. 2 is a schematic structural diagram of a backside illuminated image sensor according to an embodiment of the present invention.

The technical solution of the present invention will be described below with reference to the accompanying drawings and embodiments. FIG. 2 is a schematic structural diagram of a backside illuminated image sensor according to an embodiment of the present invention. As shown in FIG. 2, in the embodiment of the present invention, the backside illuminated image sensor comprises a semiconductor substrate 202, an epitaxial layer 211, a photodiode, a charge accumulation region 233, a channel region 234, an isolation ring, and a source region 236, a drain region (unlabeled) and a gate 235.

The photodiode comprises a first photoresistive region 231 and a second photorestive region 232 which are formed from bottom to top. In the embodiment, a surface of the first photosensitive region 231 is covered by the second photosensitive region 232. The charge accumulation region 233 covers a part of a surface of the second photosensitive region 232, the channel region 234 surrounds the second photosensitive region 232 and covers the other parts of the surface of the second photosensitive region. The isolation ring comprises a first trench isolation ring 212 and a second trench isolation ring 242 connected to the first trench isolation ring 212. The first trench isolation ring 212 extends from a surface of the epitaxial layer 211 into an interior of the epitaxial layer 211; the second trench isolation ring 242 penetrates the semiconductor substrate from the second surface an extends into the interior of the epitaxial layer 211, and is connected to the first trench isolation ring 212.

The semiconductor substrate 202, the charge accumulation region 233, the source region 236, the drain region and the second photosensitive region 232 are of a first conductivity type, while the epitaxial layer 211, the channel region 234, and the first photosensitive region 231 are of a second conductivity type, the first conductivity type is opposite to the second conductivity type. When the first conductivity type is P-type, the second conductivity type is N-type; when the first conductivity type is N-type, the second conductivity type is P-type.

The present invention adopts a full buried well structure that the photodiode is surrounded by the isolation ring, so as to realize complete isolations between the adjacent photodiodes. Specifically, since the photodiode is completely physically isolated by the isolation ring, hot carriers generated by lights incident on the photodiode will not transmit to adjacent pixels easily, instead the hot carriers will be taken away when a pixel is reset in the next frame due to the high electron mobility. As a result, low crosstalk between the adjacent pixels can be realized. In the embodiment, the top surface of the first trench isolation ring 212 is higher than the surface of the epitaxial layer 211, so as to further isolate the photodiode, and make it more convenient for preparation.

FIG. 3 is a flow chart of a preparation method of a backside illuminated image sensor according to an embodiment of the present invention, FIG. 4-FIG. 15 are schematic cross-sectional views illustrating steps in a preparation method of a backside illuminated image sensor according to an embodiment of the present invention. Please refer to FIG. 3 with FIG. 4-FIG. 15.

As shown in the figures, the preparation method comprises following steps:

S01, providing a semiconductor substrate 202.

The material of the semiconductor substrate 202 comprises one or more combinations of silicon, germanium, silicon germanium, silicon carbide, gallium arsenide, and indium gallium. The semiconductor substrate 202 can also be a silicon-on-insulator semiconductor substrate or a germanium semiconductor substrate. In this embodiment, the first conductivity type is N-type, the second conductivity type is P-type, and the semiconductor substrate 202 is an N-type silicon semiconductor substrate.

S02, performing a first thinning process on the first surface.

Figure 4:
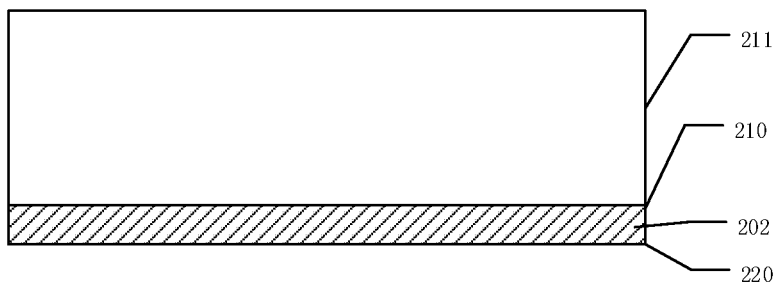
FIG. 4-FIG. 15 are schematic cross-sectional views illustrating steps in a preparation method of a backside illuminated image sensor according to an embodiment of the present invention.

As shown in FIG. 4, the first thinning process is performed to form the semiconductor substrate 202 with an appropriate thickness, thus incident lights can more easily reach the photodiode (not shown) to be formed subsequently. The thickness of the semiconductor substrate 202 after the first thinning process can be set according to the actual process requirements.

In the embodiment, firstly, the first surface 210 is thinned by backside mechanical polishing, and then interface damages are removed by a diamond knife for rapid backside polishing; secondly, the semiconductor substrate 202 is cleaned, and surface inspection to the first surface 210 is performed by a microscope. Or, the first surface 210 is thinned by a multi-step wet etching process. Specifically, the multi-step wet etching process comprises performing selective etching by using a highly oxidizing strong acid; and performing isotropic overall etching to the first surface 210 by using TMAH (tetramethylammonium hydroxide) cleaning solution. During the selective etching, the etching end point thereof is precisely controlled by controlling the doping of the semiconductor substrate 202.

S03, epitaxially growing an epitaxial layer on the first surface.

As shown in FIG. 4, the first surface is covered by the epitaxial layer 211. The epitaxial layer 211 is P-type doped, and has a thickness of 45 µm. The epitaxial layer 211 can be formed by any epitaxial growth process and P-type ion implantation process known to a person skilled in the art. After forming the epitaxial layer 211, the semiconductor substrate 202 is cleaned.

S04, forming a first trench isolation ring in the epitaxial layer.

The step S04 comprises: firstly, forming a first trench ring in the epitaxial layer, and then filling the first trench ring with a first dielectric layer to form a first trench isolation ring. The first trench isolation ring can be flush with the epitaxial layer, or can be higher than the epitaxial layer. In the embodiment shown in FIG. 5, the semiconductor substrate 202 comprises one first trench isolation ring, but it is not limited thereto, and the number of the first trench isolation rings can be determined according to the requirements. The shape and the location of the first trench ring define the shape and the location of the photodiode to be formed subsequently.

In this embodiment, S04 further comprises: before forming the first trench ring, forming a patterned sacrificial layer on the surface of the epitaxial layer, the patterned sacrificial layer having an initial opening which exposes a part of the epitaxial layer; using the initial sacrificial layer as a mask, etching a part of the epitaxial layer exposed by the initial opening to form a first trench ring, and filling a first dielectric layer in the first trench ring and the initial opening to form the first trench isolation ring; after forming the first trench isolation ring, removing the patterned sacrificial layer.

Figure 5:
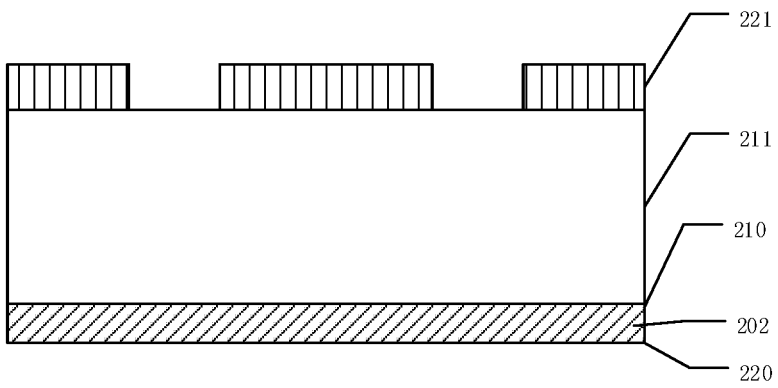
Figure 6:
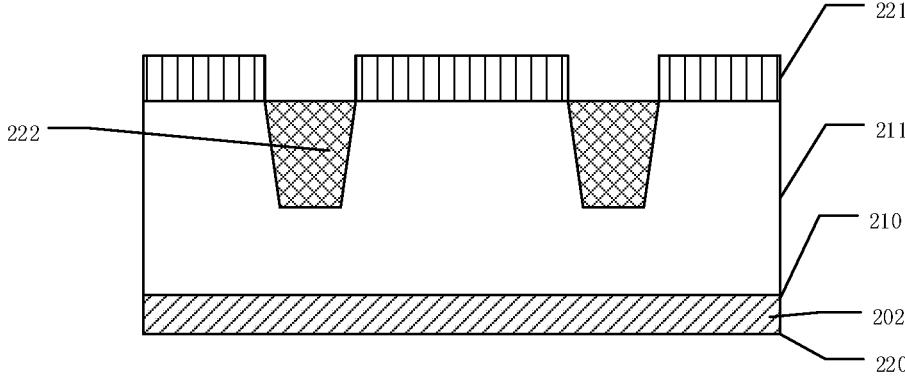
Figure 7:
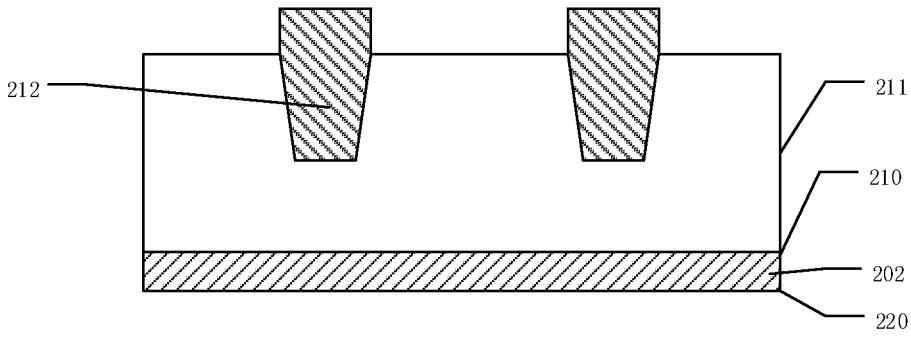

FIG. 5 to FIG. 7 are schematic diagrams illustrating the step S04 in this embodiment.

As shown in FIG. 5, the patterned sacrificial layer 221 is formed on the surface of the epitaxial layer 211. A preparation method of the patterned sacrificial layer 221 comprises: forming an initial sacrificial layer (not shown) on the epitaxial layer 211, coating a photoresist layer, defining the pattern of the first trench isolation ring (not shown) to be formed subsequently, and then etching the initial sacrificial layer to form the patterned sacrificial layer 221 having the initial opening. The preparation method of the initial sacrificial layer may use the following processes including but not limit to physical deposition, chemical deposition such as low pressure chemical vapor deposition (LPCVD), plasma enhanced chemical vapor deposition (PECVD), physical chemical deposition, pulsed laser deposition, thermal evaporation, electron beam evaporation, sputtering deposition (such as DC sputtering, radio frequency sputtering), atomic alignment, wet oxidation, dry oxidation, chemical solution oxidation, etc. In this embodiment, a material of the initial sacrificial layer comprises one or more combinations of silicon nitride, silicon carbide, silicon oxynitride, and silicon carbonitride.

As shown in FIG. 6, the first trench 222 is formed in the epitaxial layer 211 by using the patterned sacrificial layer 221 as a mask. A forming method of the first trench 222 comprises one or a combination of wet etching and dry etching. The vertical distance between the bottom surface of the first trench 222 and the surface of the epitaxial layer 211 is 2.5 µm-4.5 µm. The first trench 222 can be formed by photolithography and etching, which will not be detailed herein.

As shown in FIG. 7, the first dielectric layer (not shown) is filled in the first trench and the initial opening to form the first trench isolation ring 212. In this embodiment, after the first trench isolation ring 212 being formed, the patterned sacrificial layer 221 (not shown) is removed. The first trench isolation ring 212 is higher than the epitaxial layer 211. The first trench isolation ring 212 isolates the electrical signal interference.

S05, forming a first pattern layer having a first opening on the epitaxial layer, the epitaxial layer within the first trench isolation ring being exposed by the bottom of the first opening.

S06, using the first pattern layer as a first mask and performing an ion implantation process to form a photodiode and an initial charge accumulation region sequentially in the epitaxial layer at the bottom of the first opening, the initial charge accumulation region being formed on the photodiode.

Figure 8:
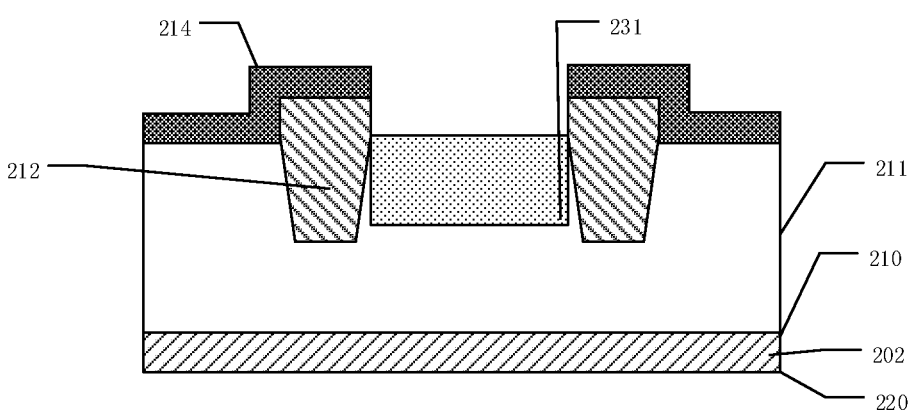

The photodiode comprises a first photosensitive region and a second photosensitive region, FIG. 8 is a schematic diagram showing the formation of the first photosensitive region. As shown in FIG. 8, the first pattern layer 214 is used as a first mask, and the first photosensitive region 231 is formed in the epitaxial layer exposed at the bottom of the first opening by a first ion implantation process. The vertical distance between the bottom surface of the trench isolation ring and the first surface of the semiconductor substrate 202 is less than the vertical distance between the bottom surface of the first photosensitive region 231 and the first surface of the semiconductor substrate 202. The first photosensitive region 231 is formed by a first ion implantation. The first ion implantation is a high-energy implantation process of boron ions with a first implantation energy of 120 keV-200 keV. In this embodiment, the first ion implantation is performed at an angle of 90°. The vertical distance between the bottom surface of the first photosensitive region 231 and the surface of the epitaxial layer 211 is 0.8 µm-2.5 µm. It should be noted that, in other embodiments, the first photosensitive region 231 can be formed in the epitaxial layer 211 by directly using a mask without the photoresist.

Then, the second photosensitive region 232 is formed on the first photosensitive region 231.

Figure 9:
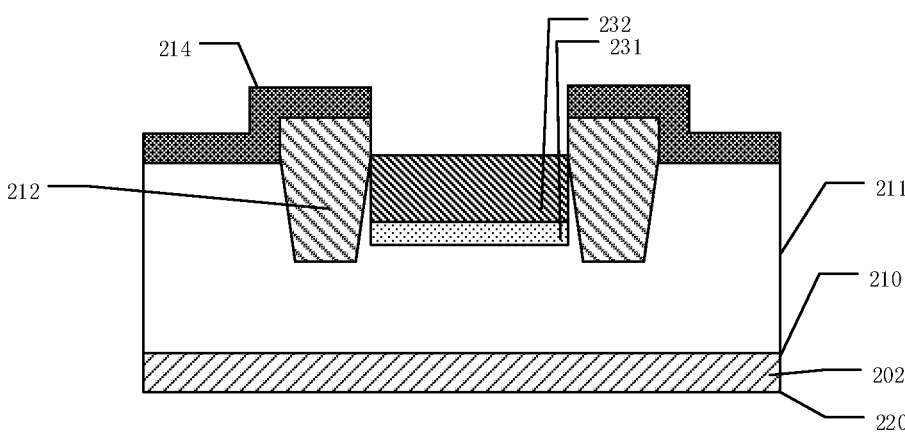

As shown in FIG. 9, the second photosensitive region 232 is formed on the first photosensitive region 231 by performing a second ion implantation. The second ion implantation is a large beam current implantation process of phosphorus ions with a second implantation energy of 60 keV-80 keV. The second implantation energy is less than the first implantation energy. The second photosensitive region 232 is formed on the first photosensitive region 231 by the second ion implantation. In this embodiment, the vertical distance between the bottom surface of the second photosensitive region and the surface of the epitaxial layer is 0.3 µm-0.7 µm. The second photosensitive region 232 does not occupy additional pixel areas, so as to effectively improve the photosensitive sensitivity and expand the full well charge capacity of a pixel. The first photosensitive region 231 can accommodate more induced charges than pixels of the same area, thus it is suitable for pixel designs below 1.5 micrometers in size.

Next, the initial charge accumulation region is formed on a surface of the second photosensitive region 232.

Figure 10:
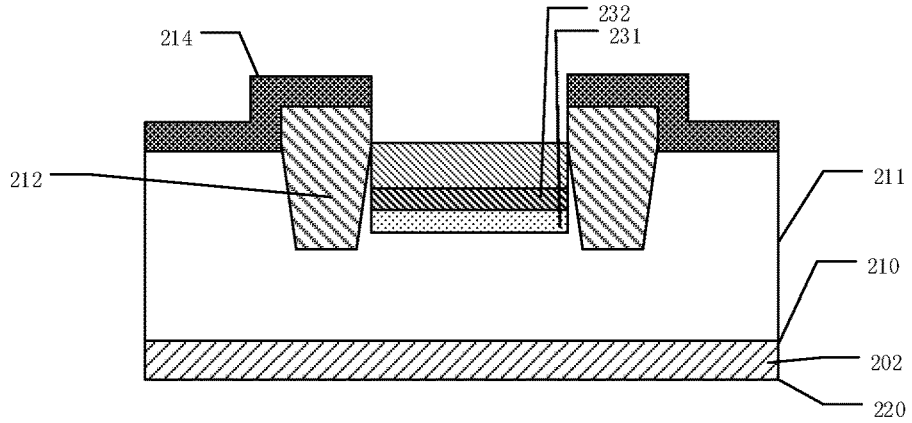

As shown in FIG. 10, the initial charge accumulation region is formed on a surface of the second photosensitive region 232 by performing a third ion implantation. The third ion implantation is a medium beam current implantation process of phosphorus ions with a third implantation energy of 60 keV-80 keV. The third implantation energy is less than the second implantation energy. In this embodiment, the vertical distance between the bottom surface of the initial charge accumulation region and the surface of the epitaxial layer 211 is 0.01 µm-0.3 µm.

S07, removing the first pattern layer.

S08, forming a second pattern layer having a second opening on the epitaxial layer, a bottom of the second opening exposing a part of the initial charge accumulation region which is adjacent to the first trench isolation ring.

S09, using the second pattern layer as a second mask and doping the initial charge accumulation region at the bottom of the second opening to form a channel region, wherein the initial charge accumulation region outside the bottom of the second opening forms a charge accumulation region.

S10, removing the second pattern layer.

Figure 11:
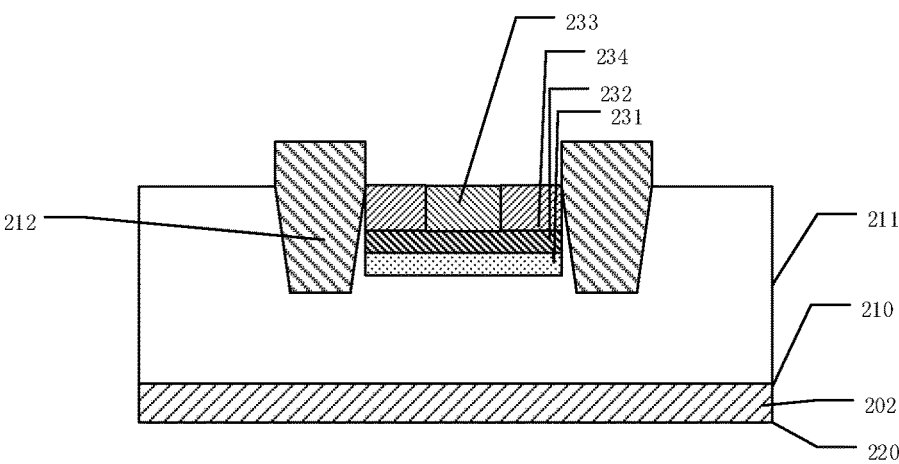

As shown in FIG. 11, which is a combined schematic diagram of S07 to S10, a part of the initial charge accumulation region is implanted by a fourth ion implantation with fourth ions to form the channel region 234, and the remaining part of the initial charge accumulation region which is not implanted forms the charge accumulation region 233. The fourth ion implantation comprises implanting boron ions with a fourth implantation energy which is 3 times to 5 times of the third implantation energy. Multiple implantations are performed within the first trench isolation ring 212 to form a vertically distributed photosensitive region (not shown) and a floating region (not shown) for charge accumulation, so as to reduce the parasitic capacitance of the charge transfer tube, improve the transfer rate, and enhance the image frame rate of an image sensor chip.

S11, forming a gate covering a surface of the charge accumulation region and extending to cover a part of a surface of the channel region.

Figure 12:
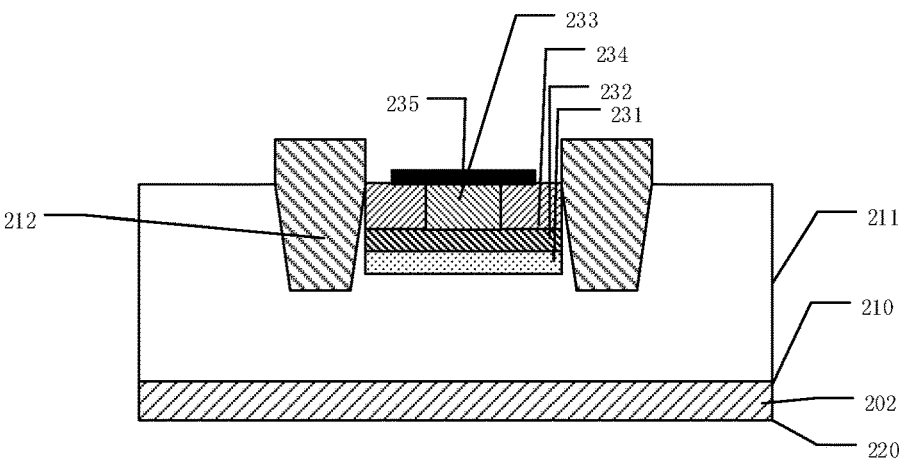

As shown in FIG. 12, the gate 235 is formed on the charge accumulation region 233, and crosses the charge accumulation region 233 and the adjacent channel region 234. For example, firstly, an oxide layer (not shown) is formed on the epitaxial layer by a thermal oxidation process to cover the first trench isolation ring 212, the charge accumulation region 233 and the channel region 234, secondly, a polysilicon layer (not shown) is deposited on the oxide layer, and then a patterned photoresist layer is formed on the polysilicon layer, the patterned photoresist layer is used as a mask to etch the polysilicon layer and the oxide layer by dry etching or wet etching until the gate 235 is formed.

S12, forming a third pattern layer having a third opening on the epitaxial layer, a bottom of the third opening exposing the channel region between the first trench isolation ring and the gate.

S13, using the third pattern layer as a third mask and doping the channel region at the bottom of the third opening to respectively form a source region and a drain region.

Figure 13:
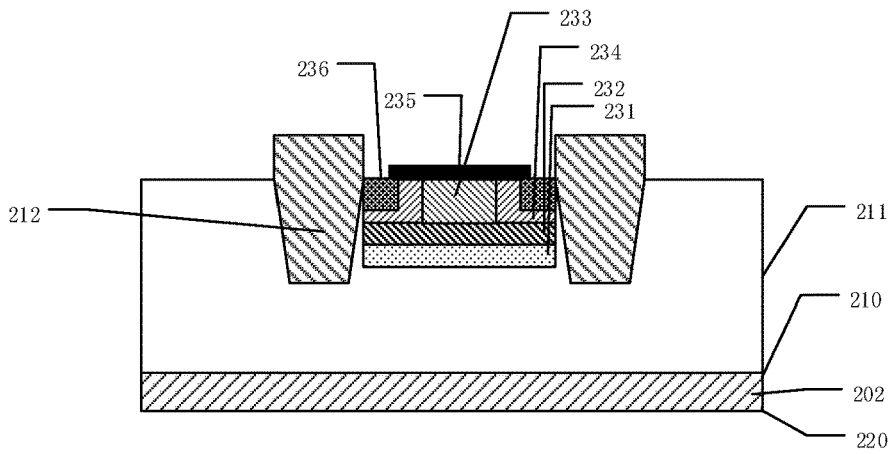

As shown in FIG. 13, the source region 236 and the drain region extend from the surface of the channel region to the interior of the channel region, and are formed at two sides of the charge accumulation region respectively and separated by the charge accumulation region. In this embodiment, the source region 236 and the drain region are formed by a fifth ion implantation of phosphorus ions with an implantation angle is 60°.

By performing multiple ion implantations on the initial charge accumulation region, a three-dimensional N/P/N structure or P/N/P structure is formed, then a gate covering the surface of the charge accumulation region is formed. The photodiode formed in the present invention is perpendicular to the first surface, thus a conductive channel perpendicular to the first surface is finally formed.

S14, removing the third pattern layer, and performing a second thinning process on the second surface.

S15, forming a second trench isolation ring penetrating the semiconductor substrate from the second surface and extending into the epitaxial layer to be connected to the first trench isolation ring.

Figure 14:
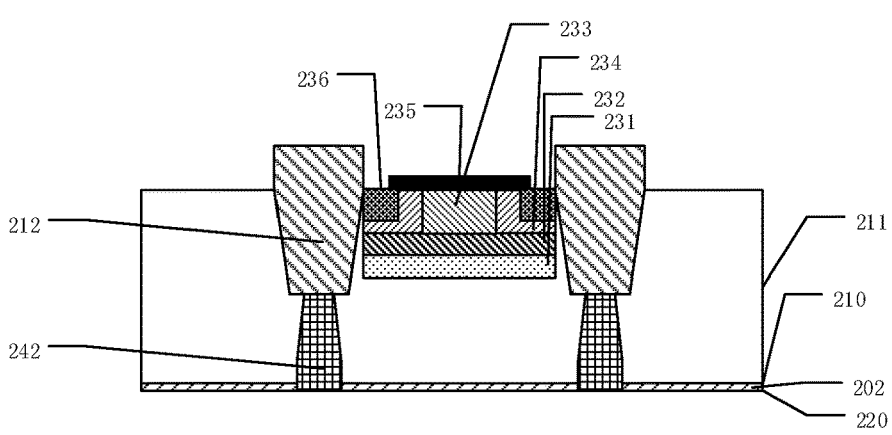

FIG. 14 is a combined schematic diagram of S14 and S15, the second thinning process is performed on the second surface 220 of the semiconductor substrate 202; the semiconductor substrate is etched on the second surface 220 of the thinned semiconductor substrate 202, and a plurality of second trenches (not shown) are formed in the semiconductor substrate 202, which are disposed opposite and connected to the first trench (not shown). Then, an isolation material is formed in the second trenches to form a second trench isolation ring 242. In an embodiment, a silicon dioxide material is deposited in the second trench by high-density plasma chemical vapor deposition, then the second trench isolation ring 242 is formed.

The semiconductor substrate 202 is of a first conductivity type, the second trench isolation ring 242 is of a second conductivity type. In another embodiment, the second trench isolation ring 242 is formed by an ion implantation on the second surface 220 of the semiconductor substrate 202. Compared with the traditional backside illuminated image sensor, the semiconductor substrate 202 is further thinned, red lights with lower energy can be absorbed by the second photosensitive region 232, thus a longer infrared light-induced charge path can be formed, which effectively improves the infrared imaging capability.

Figure 15:
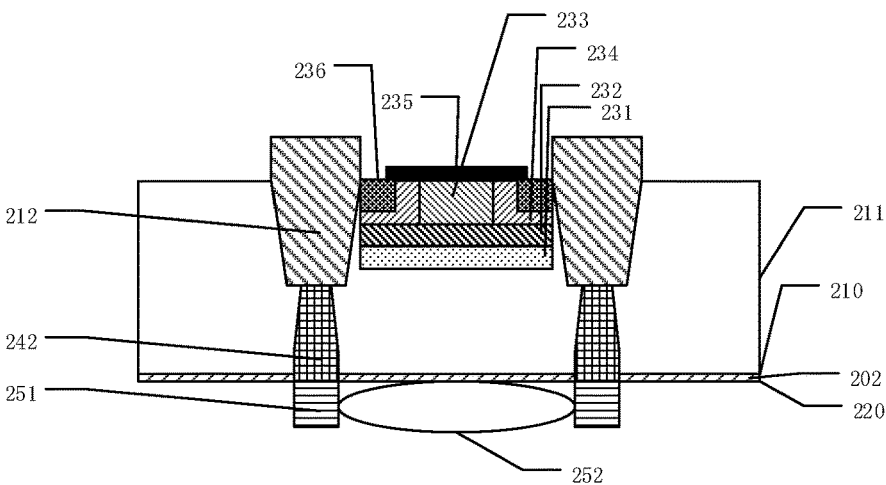

As shown in FIG. 15, a photosensitive device 252 and a light shielding layer 251 are respectively formed on the second surface. Wherein, the photodiode is covered by the photosensitive device 252, the light shielding layer 251 surrounds the photosensitive device 252 and covers the photodiode. The material of the light shielding layer 251 comprises one or more combinations of silicon oxide, silicon nitride, silicon oxynitride, low-K dielectric materials and ultra-low-K dielectric materials. The photosensitive device 252 receives lights from the second surface 220 of the semiconductor substrate 202 and focuses on the first photosensitive region. The photosensitive device 252 can comprise, but not limited to a red color filter, a green color filter, a blue color filter, or other color filters selected as required.

The above are only the preferred embodiments of the present invention, and the embodiments are not intended to limit the scope of patent protection of the present invention. Therefore, any equivalent structural changes made by using the contents of the description and drawings of the present invention shall also comprise within the protection scope of the present invention.

What is claimed is:

1. A backside illuminated image sensor, comprising:
a semiconductor substrate having a first surface and a second surface opposing to the first surface;
an epitaxial layer covering the first surface;
a photodiode formed in the epitaxial layer;
a charge accumulation region and a channel region formed on a surface of the photodiode respectively, the charge accumulation region being surrounded by the channel region;
an isolation ring surrounding the photodiode and the channel region and penetrating the semiconductor substrate and the epitaxial layer;
a source region and a drain region, extending from a surface of the channel region to an interior of the channel region, which are formed at two sides of the charge accumulation region respectively and separated by the charge accumulation region;
a gate covering a surface of the charge accumulation region, and extending over the surface of the channel region along a first direction to a surface of the source region; wherein, the photodiode comprises a first photosensitive region and a second photosensitive region, and the second photosensitive region is formed on the first photosensitive region and covers a surface of the first photosensitive region.

2. The backside illuminated image sensor of claim 1, further comprising: a photosensitive device and a light shielding layer respectively formed on the second surface, wherein the photosensitive device covers the photodiode, and the light shielding layer surrounds the photosensitive device and covers the isolation ring correspondingly.

3. The backside illuminated image sensor of claim 1, wherein, the isolation ring comprises a first trench isolation ring and a second trench isolation ring, wherein the first trench isolation ring extends from a surface of the epitaxial layer into an interior of the epitaxial layer; the second trench isolation ring penetrates the semiconductor substrate by extending from the second surface into the epitaxial layer, and is connected to the first trench isolation ring.

4. The backside illuminated image sensor of claim 3, wherein, a top surface of the first trench isolation ring is higher than the surface of the epitaxial layer.

5. The backside illuminated image sensor of claim 1, wherein, a vertical distance between a bottom surface of the first trench isolation ring and the first surface is less than a vertical distance between a bottom surface of the photodiode and the first surface.

6. The backside illuminated image sensor of claim 1, wherein, the semiconductor substrate, the charge accumulation region, the source region and the second photosensitive region are of a first conductivity type, the epitaxial layer, the channel region and the first photosensitive region are of a second conductivity type, the first conductivity type is opposite to the second conductivity type.

7. A preparation method for a backside illuminated image sensor, comprising:
S01, providing a semiconductor substrate having a first surface and a second surface opposing to the first surface;
S02, performing a first thinning process on the first surface;
S03, epitaxially growing an epitaxial layer on the first surface;
S04, forming a first trench isolation ring in the epitaxial layer;
S05, forming a first pattern layer having a first opening on the epitaxial layer, a bottom of the first opening exposing the epitaxial layer in the first trench isolation ring;
S06, using the first pattern layer as a first mask and performing an ion implantation process to form a photodiode and an initial charge accumulation region sequentially in the epitaxial layer at the bottom of the first opening, the initial charge accumulation region being formed on the photodiode;
S07, removing the first pattern layer;
S08, forming a second pattern layer having a second opening on the epitaxial layer, a bottom of the second opening exposing a part of the initial charge accumulation region, which is adjacent to the first trench isolation ring;
S09, using the second pattern layer as a second mask and doping the initial charge accumulation region at the bottom of the second opening to form a channel region, wherein the initial charge accumulation region outside the bottom of the second opening forms a charge accumulation region;
S10, removing the second pattern layer;

S11, forming a gate covering a surface of the charge accumulation region and extending to cover a part of a surface of the channel region;

S12, forming a third pattern layer having a third opening on the epitaxial layer, a bottom of the third opening exposing the channel region between the first trench isolation ring and the gate;

S13, using the third pattern layer as a third mask and doping the channel region at the bottom of the third opening to form a source region and a drain region respectively;

S14, removing the third pattern layer, and performing a second thinning process on the second surface;

S15, forming a second trench isolation ring penetrating the semiconductor substrate from the second surface and extending into the epitaxial layer to be connected to the first trench isolation ring.

8. The preparation method of claim 7, wherein, the step of performing the ion implantation process to form the photodiode and the initial charge accumulation region sequentially in the epitaxial layer at the bottom of the first opening comprises: forming a first photosensitive region by a first ion implantation, and forming a second photosensitive region on the first photosensitive region by a second ion implantation, wherein the first photosensitive region and the second photosensitive region form the photodiode; forming the initial charge accumulation region by a third ion implantation; wherein, the first ion implantation comprises implanting boron ions with a first implantation energy; the second ion implantation comprises implanting phosphorus ions with a second implantation energy; the third ion implantation comprises implanting phosphorus ions with a third implantation energy.

9. The preparation method of claim 8, wherein, the second implantation energy is less than the first implantation energy, and greater than the third implantation energy.

10. The preparation method of claim 9, wherein, the channel region is formed by a fourth ion implantation, the fourth ion implantation comprises implanting boron ions with a fourth implantation energy which is 3~5 times of the third implantation energy; the source region and the drain region are formed by a fifth ion implantation, and implanted ions thereof comprise phosphorus ions.

* * * * *